United States Patent
Do et al.

(10) Patent No.: US 10,339,995 B2
(45) Date of Patent: Jul. 2, 2019

(54) MEMORY DEVICE FOR CONTROLLING REFRESHING OPERATION

(71) Applicant: Samsung Electronics Co., Ltd., Suwon-si, Gyeonggi-do (KR)

(72) Inventors: Sung-geun Do, Seongnam-si (KR); Jong-ho Lee, Seoul (KR); Chan-yong Lee, Suwon-si (KR); Min-soo Jang, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/830,314

(22) Filed: Dec. 4, 2017

(65) Prior Publication Data
US 2018/0190341 A1    Jul. 5, 2018

(30) Foreign Application Priority Data
Dec. 29, 2016  (KR) .................. 10-2016-0182886

(51) Int. Cl.
  *G11C 11/406* (2006.01)
  *G11C 11/4063* (2006.01)
  *G11C 11/4074* (2006.01)

(52) U.S. Cl.
  CPC .... *G11C 11/40615* (2013.01); *G11C 11/4063* (2013.01); *G11C 11/4074* (2013.01); *G11C 11/40618* (2013.01); *G11C 2211/4067* (2013.01); *G11C 2211/4068* (2013.01)

(58) Field of Classification Search
  CPC ................. G11C 11/406; G11C 11/40615
  USPC ........................................ 365/222
  See application file for complete search history.

(56) References Cited

U.S. PATENT DOCUMENTS

| | | | |
|---|---|---|---|
| 5,453,959 A * | 9/1995 | Sakuta ........... | G11C 11/406 365/189.09 |
| 5,654,913 A * | 8/1997 | Fukushima ....... | G11C 11/4074 365/149 |
| 5,798,976 A * | 8/1998 | Arimoto .......... | G11C 11/406 365/222 |
| 7,206,245 B2 | 4/2007 | Seitz et al. | |
| 7,349,279 B2 | 3/2008 | Tsern et al. | |
| 7,492,658 B2 | 2/2009 | Oh | |
| 8,004,920 B2 * | 8/2011 | Ito .............. | G11C 5/147 365/189.09 |
| 8,819,298 B2 | 8/2014 | Ito et al. | |
| 9,076,504 B2 | 7/2015 | Lee et al. | |
| 9,147,461 B1 | 9/2015 | Youn et al. | |
| 2005/0088894 A1 | 4/2005 | Brucke | |

* cited by examiner

*Primary Examiner* — Son L Mai
(74) *Attorney, Agent, or Firm* — Harness, Dickey & Pierce, P.L.C.

(57) ABSTRACT

Provided is a memory device capable of reducing power consumption. The memory device includes a plurality of memory cells; and a self refresh controller configured to perform a refreshing cycle, which includes a first time interval and a second time interval, for a plurality of number of times, the second time interval being longer than the first section, wherein the self refresh controller is configured to perform a burst refreshing operation during the first time interval and to perform a power supply controlling operation during the second time interval.

19 Claims, 15 Drawing Sheets

US 10,339,995 B2

MEMORY DEVICE FOR CONTROLLING REFRESHING OPERATION

CROSS-REFERENCE TO RELATED APPLICATION

This application claims the benefit of Korean Patent Application No. 10-2016-0182886, filed on Dec. 29, 2016, in the Korean Intellectual Property Office, the disclosure of which is incorporated herein in its entirety by reference.

BACKGROUND

Example embodiments of the inventive concepts relate to a memory device. For example, at least some example embodiments relate to a memory device that controls a refreshing operation, such as a self refreshing operation.

A volatile memory device, such as dynamic random access memory (DRAM), may perform a refreshing operation to retain stored data. Meanwhile, along with the development of mobile devices, various techniques for reducing power consumption of volatile memory devices are being proposed. For example, it may be desirable to reduce power consumed due to a refreshing operation.

SUMMARY

Some example embodiments of the inventive concepts provide a memory device capable of reducing power consumption due to a refreshing operation.

According to an example embodiment of the inventive concepts, a memory device may include a plurality of memory cells; and a self refresh controller configured to perform a refreshing cycle a plurality of times, the refreshing cycle including, a burst refreshing operation performed during a first time interval, and a power supply controlling operation performed during a second time interval, the second time interval being longer than the first time interval.

According to another example embodiment of the inventive concepts, a memory device may include a plurality of memory cells; at least one driver configured to drive the plurality of memory cells; and a self refresh controller configured to perform a refreshing cycle a plurality of times, the refreshing cycle including, applying a first voltage to the at least one driver and performing a burst refreshing operation on memory cells corresponding to a plurality of address signals during a first time interval, and applying a second voltage to the at least one driver during a second time interval, the second voltage being lower than that first voltage, the second time interval being longer than the first time interval According to another example embodiment, a self-refresh controller may be configured to control a memory cell array, the self-refresh controller may include a memory; and processing circuitry configured to iteratively, perform a burst refreshing operation on the memory cell array during a first time interval, and perform a power supply controlling operation on the memory cell array during a second time interval, the second time interval being subsequent to and longer than the first time interval.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
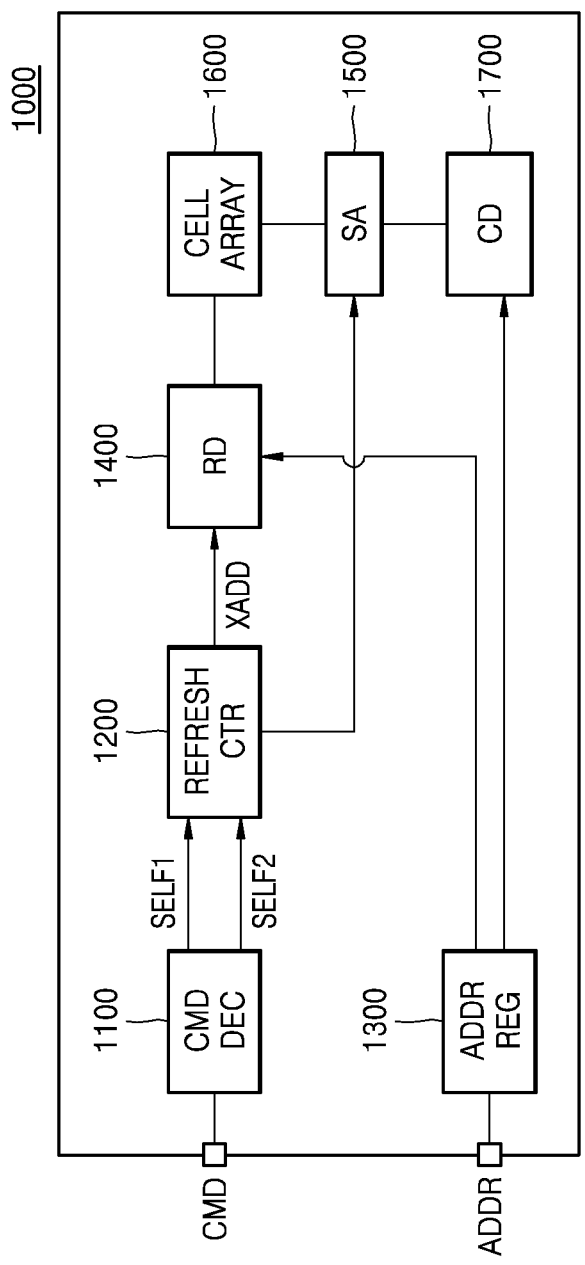
FIG. 1 is a block diagram showing a memory device according to an example embodiment of the inventive concepts.

FIG. 1 is a block diagram showing a memory device according to an example embodiment of the inventive concepts.

Referring to FIG. 1, a semiconductor memory device 1000 may include a command decoder (CMD DEC) 1100, a refresh controller (REFRESH CTR) 1200, an address register (ADDR REG) 1300, a row decoder (RD) 1400, a sense amplifier (SA) 1500, a memory cell array (CELL ARRAY) 1600, and a column decoder (CD) 1700.

The command decoder 1100 decodes a command CMD received from an external device (e.g., a memory controller). The command CMD may be a combination of one or more instructions, and the semiconductor memory device 1000 may enter the refreshing mode according to combinations of the instructions. For convenience of explanation, example embodiments of the inventive concepts will be described below in relation to a self refreshing operation. However, example embodiments are not limited thereto.

The command decoder 1100 decodes the command CMD and generates a first self refresh signal SELF1 or a second self refresh signal SELF2 and provides the first self refresh signal SELF1 or the second self refresh signal SELF2 to the refresh controller 1200. The refresh controller 1200 controls a refreshing operation regarding the memory cell array 1600 in response to the first and/or second self refresh signal SELF1 or SELF2. For example, the refresh controller 1200 includes a component like a counter to generate an internal address XADD for performing a refreshing operation and outputs the generated internal address XADD to the row decoder 1400 as a row address.

The address register 1300 stores an address signal ADD received from the outside and the stored address signal ADD is transferred to the row decoder 1400 and the column decoder 1700. An address signal ADD may include a row address and a column address. During a normal operation of the semiconductor memory device 1000, a row address and a column address for accessing the memory cell are received. Alternatively, a row address for selecting an area to be refreshed may be provided from the outside. In this case, a row address for performing a refreshing operation may be provided from the address register 1300 to the row decoder 1400. Although not shown, a selecting circuit (not shown) for selectively outputting an address signal ADD stored in the address register 1300 or an internal address XADD from the refresh controller 1200 may be further included in the semiconductor memory device 1000.

During a self refreshing operation, an internal address XADD is generated by the refresh controller 1200 and transferred to the row decoder 1400. The refresh controller 1200 may also generate a signal to drive the sense amplifier 1500 during the self refreshing operation.

The row decoder 1400 activates word lines corresponding to a row address, and the column decoder 1700 activates bit lines corresponding to a column address.

During the self refreshing operation, when word lines are activated by the row decoder 1400, data of memory cells connected to the activated word line is sensed and amplified by the sense amplifier 1500 through corresponding bit lines, and the amplified data is stored again in the original memory cells.

The memory cell array 1600 receives write data according to decoding results of the row decoder 1400 and the column decoder 1700 or outputs read data to the sense amplifier/write driver 1500. The memory cell array 1600 may include a plurality of banks (not shown), and each of the plurality of banks may include a plurality of word lines, a plurality of bit lines, and memory cells disposed at points where the plurality of word lines intersect with the plurality of bit lines.

Figure 2:
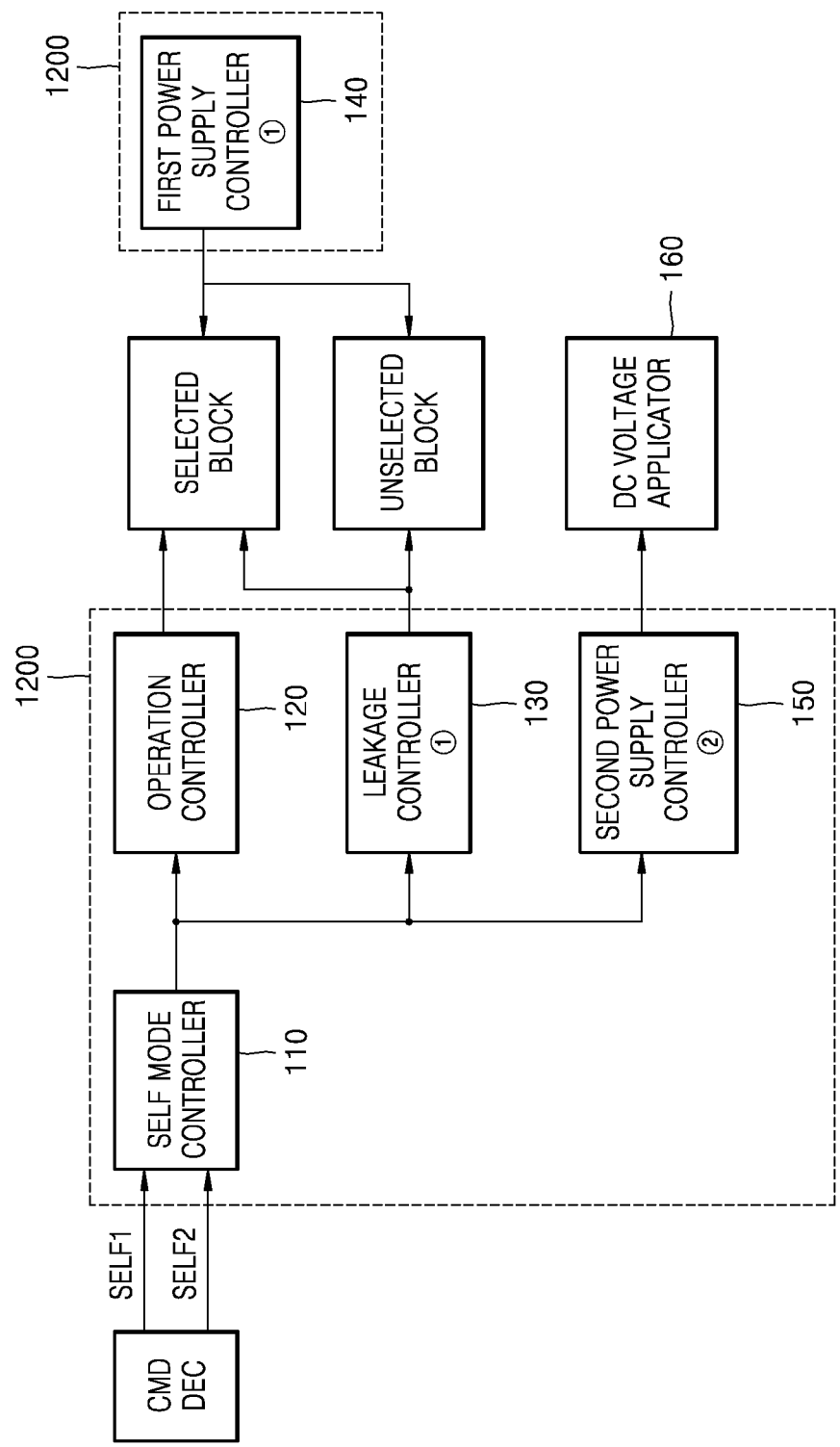
FIGS. 2 and 3 are block diagrams showing a refresh controller of a memory device according to example embodiments of the inventive concepts in closer detail.
Figure 3:
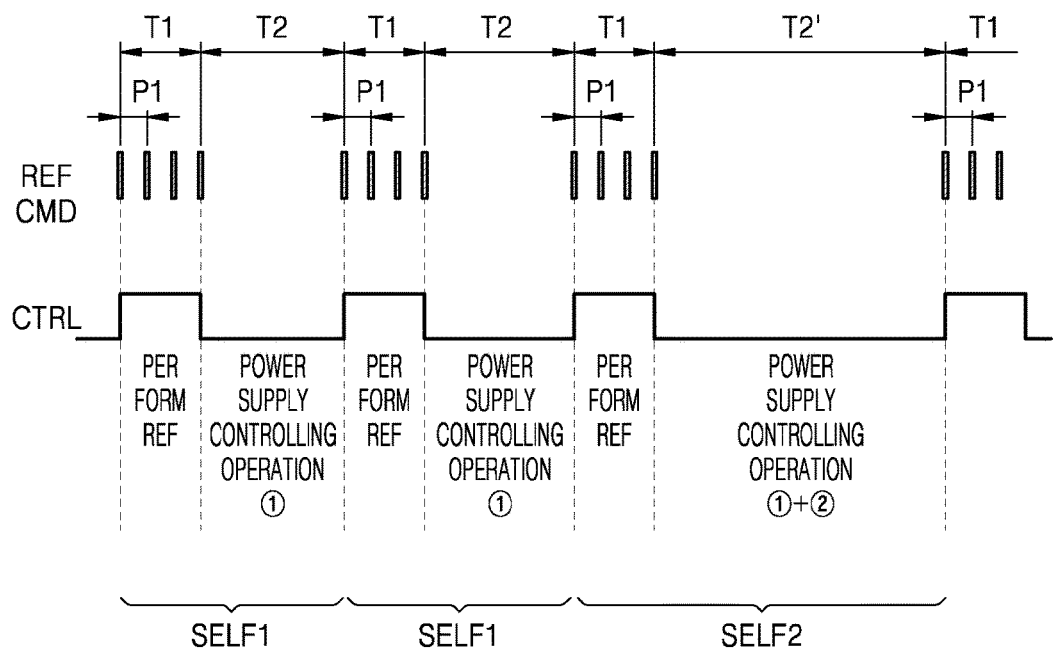

FIGS. 2 and 3 are block diagrams showing a refresh controller of a memory device according to example embodiments of the inventive concepts in closer detail.

Referring to FIG. 2, the refresh controller 1200, which may be a self refresh controller for example, may include a self mode controller 110, an operation controller 120, a leakage controller 130, a first power supply controller 140, and a second supply controller 150.

The self mode controller 110 may be configured to activate the operation controller 120, the leakage controller 130, the first power supply controller 140, and/or the second supply controller 150 in response to the first and/or second self refresh signal SELF1 or SELF2. For example, the self mode controller 110 may be configured to activate the operation controller 120, the leakage controller 130, and the first power supply controller 140 in response to the first self refresh signal SELF1. The self mode controller 110 may also configured to activate the operation controller 120, the leakage controller 130, the first power supply controller 140, and the second power second supply controller 150 in response to the second self refresh signal SELF2.

The operation controller 120 is configured to perform a refreshing operation. More specifically, as shown in FIG. 3, the operation controller 120 may be configured to perform a refreshing cycle including a first time interval T1 and a second time interval T2 for a plurality of number of times, the second time interval T2 being longer than the first time interval T1. The operation controller 120 may be configured to receive an oscillation signal and generate a plurality of address signals.

As shown in FIG. 3, the operation controller 120 may perform a refreshing operation intensively during the first time interval T1 and perform a power supply control operation to reduce power consumption during the second time interval T2. A period P1 of the refreshing operation performed during the first time interval T1 may be one to ten times longer than tRFCmin (the minimum time between refresh cycles for cells of a given row). However, example embodiments of the inventive concepts are not limited to the above-stated numbers (i.e. 1 to 10 times longer than tRFCmin) and may be applied to any operation for performing a burst refreshing operation based on a time period that is several times longer than tRFCmin.

According to the current technical level, tRFCmin is from about 90 nanoseconds to about 350 nanoseconds, whereas a typically employed refreshing operation period tREFi is from about 4 microseconds to about 8 microseconds, which is a period at least from dozens to hundreds times longer than tRFCmin. According to example embodiments of the inventive concepts, a refreshing operation that is performed with a conventional long period (tREFi) in the related art is instead intensively performed during a short time period and a low power operation mode is performed through a leakage controller and a power supply controller for a remaining time period, thereby reducing power consumption.

More specifically, for example, when a standard refresh time StREFi is 8 microseconds and the number of rows to be refreshed during one period is 8192, a refreshing operation performed on the corresponding row may take about 64 milliseconds. On the other hand, a refreshing operation according to example embodiments of the inventive concepts may be performed by i) performing a refreshing operation for all rows for about 740 microseconds when the refreshing operation is performed for BtREFi=90 nanoseconds, or ii) performing a refreshing operation for all rows for about 2.9 milliseconds when the refreshing operation is performed for BtREFi=350 nanoseconds. Therefore, a low power operation may be performed from i) about 63 milliseconds to ii) about 61 milliseconds.

The above-stated example is a calculation based on all rows of one block, and a refreshing operation according to example embodiments of the inventive concepts may also be performed on some rows of one block. For example, when the number of rows in one block is 8192, a refreshing operation may be performed on 3000 rows during a first time interval, a low power operation may be performed during a second time interval, and then a refreshing operation may be performed again on 3000 rows during the first time interval.

In other words, according to example embodiments of the inventive concepts, a refreshing operation is intensively performed for a short time period of several milliseconds at the initial stage of a refreshing process (hereinafter referred to as a "burst refresh") and gate-induced drain leakage (GIDL), power gating (PG), and direct current (DC) controlling are optimized through a switching operation for the remaining time period.

In the related art, since a refreshing operation is performed at a constant and sufficient period StREFi, it may be desirable to maintain power supply to devices including related switches during the corresponding period. Furthermore, in the related art, even when a power controlling operation is performed, it may be desirable to perform a switching operation for controlling power every time a refreshing operation is performed for a long period, and thus power loss occurs due to a switching operation.

On the other hand, according to example embodiments of the inventive concepts, a refreshing operation is performed for only a short period BtREFi for the initial first time interval T1 and refreshing operation may not be performed (or, alternatively may be skipped) during the second time intervals T2 corresponding to the number of bursts after a burst refresh. Accordingly, power consumption may be reduced during the second time intervals T2. For example, when StREFi=8 microseconds, BtREFi=160 nanoseconds, and a burst refresh is performed on 1000 rows, power consumption may be reduced for (StREFi−BtREFi) *1000=7.84 milliseconds. Since a time interval is divided and a switching operation for controlling power is performed only once at a specific time point after a burst refresh, power loss due to the switching operation may also be reduced.

Referring back to FIG. 2, the leakage controller 130 may be configured to control a switching unit (SU in FIG. 5) that drives a memory cell to perform a gate-induced drain leakage (GIDL) controlling operation during the second time interval T2. For example, the leakage controller 130 may apply a first voltage to the switching unit during the first time interval T1 and apply a second voltage to the switching unit during the second time interval T2, the second voltage being lower than the first voltage.

The first power supply controller 140 may be configured to perform a power supply controlling operation regarding memory cells arranged in a selected block (that is, a refresh target block) and/or an unselected block (that is, a block that is not to be refreshed) from among a plurality of memory cells. For example, the first power supply controller 140 may be configured to perform a power gating (PG) controlling operation during the first time interval T1 and the second time interval T2.

The PG controlling operation may be defined as an operation for activating/deactivating a switching device relating to the driving circuit for performing a refreshing operation. For example, a voltage applied to a gate of a switching device during a PG controlling operation may be controlled. More specifically, during a PG controlling operation, a voltage applied to a gate of a switching device (hereinafter referred to as a row switching device) connected to a row decoder connected to memory cells of a selected block and/or an unselected block may be controlled. Additional example embodiments related to a PG controlling operation will be described below.

The second power second supply controller 150 may be configured to perform an additional power supply control operation regarding memory cells arranged in a selected block and/or an unselected block. For example, the second power second supply controller 150 may be configured to perform a direct current (DC) controlling operation for controlling a DC voltage applicator 160 during the first time interval T1 and/or the second time interval T2.

A DC controlling operation may be defined as an operation for activating/deactivating a circuit for generating a DC voltage supplied to a switching device (e.g., an input/output switching circuit) irrelevant from a refreshing operation. While a PG controlling operation is an operation for controlling whether to transfer a voltage supplied from a power source through a switching operation, a DC controlling operation is an operation for activating/deactivating a power source itself. Additional example embodiments related to a DC controlling operation will be described below.

When the first self refresh signal SELF1 is applied to the self mode controller 110, a burst refresh may be performed during the first time interval T1, and a GIDL controlling operation and a PG controlling operation may be performed during the second time interval T2. When the second self refresh signal SELF2 is applied to the self mode controller 110, the semiconductor memory device 1000 enters a deep sleep mode, during which a DC controlling operation may be performed in addition to the GIDL controlling operation and the PG controlling operation during the second time interval T2.

According to another example embodiment, when the second self refresh signal SELF2 is applied to the self mode controller 110, the self mode controller 110 may generate a deep sleep signal and the operation controller 120 may increase the second time interval T2 to a second time interval T2' in response to the deep sleep signal. According to another example embodiment, the second self refresh signal SELF2 may be used as the deep sleep signal.

Figure 4:
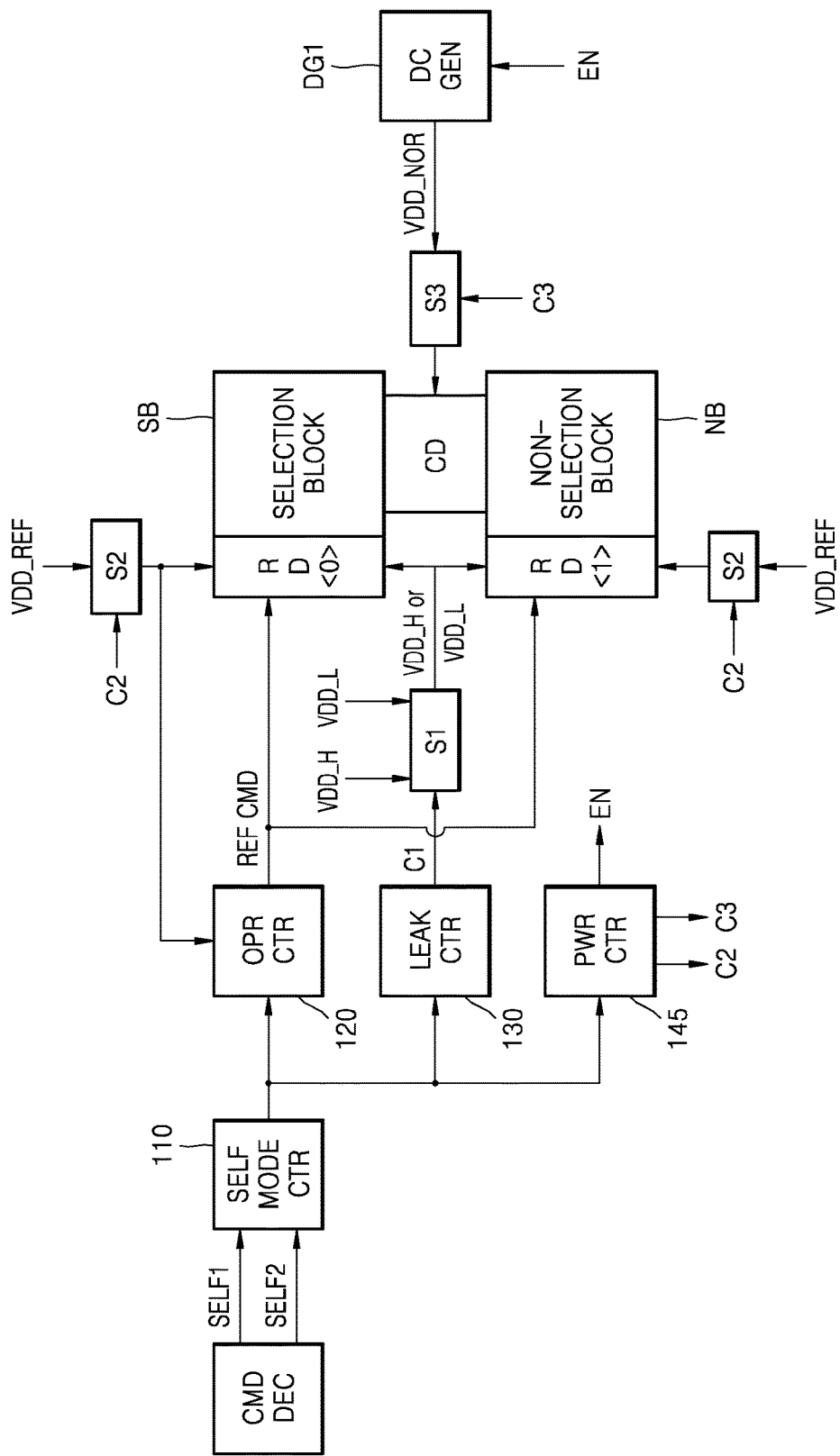
FIG. 4 is a schematic diagram showing a memory device according to other example embodiments of the inventive concepts.

FIG. 4 is a schematic diagram showing a memory device according to other example embodiments of the inventive concepts. The memory device according to other example embodiments may be a modification of the memory device according to the above-described example embodiments. Redundant descriptions thereof are omitted below.

Referring to FIG. 4, memory cells arranged in a selected block SB may be connected to a first row decoder RD<0> and a column decoder CD. Furthermore, memory cells arranged in an unselected block NB may be connected to a second row decoder RD<1> and the column decoder CD.

The memory device may include a first switch S1, a second switch S2, a third switch S3, and a DC voltage generator DG1. The leakage controller 130 may be configured to generate a first control signal C1 for controlling the first switch S1 and a power supply controller 145, and the power supply controller 145 may be configured to generate second and third control signals C2 and C3 for controlling the second and third switches S2 and S3.

The power supply controller 145 of the present example embodiment may have a configuration including the first power supply controller 140 and the second power second supply controller 150 of the example embodiment of FIG. 2.

The first switch S1 may be configured to receive the first control signal C1 from the leakage controller 130 and apply a first voltage VDD_H or a second voltage VDD_L to a driver within a row decoder, based on the first control signal C1, the second voltage VDD_L being lower than the first voltage VDD_H. Via the first switch S1, the first voltage VDD_H may be applied to the driver during the first time interval T1, and the second voltage VDD_L may be applied to the driver during the second time interval T2 (refer to SW0 and SW1 of FIG. 13), the second voltage VDD_L being lower than the first voltage VDD_H.

The second switch S2 may be configured to receive the second control signal C2 from the power supply controller 145 and transfer a power voltage VDD_REF used for a refreshing operation to the first and second row decoders RD<0> and RD<1>, based on the second control signal C2. The first and second row decoders RD<0> and RD<I> may be configured to perform a refreshing operation by using the power voltage VDD_REF. The power supply controller 145 (in particular, the first power supply controller 140 of FIG. 2) may perform operations of activating/deactivating a switching device connected to row decoders RD<0> and RD<I> via the second switch S2 (refer to SW2 of FIG. 13).

The third switch S3 may be configured to receive the third control signal C3 from the power supply controller 145 and transfer a power voltage VDD_NOR used by the column decoder CD to the column decoder CD, based on the third control signal C3. The column decoder CD may be configured to perform an inputting/outputting operation by using the power voltage VDD_NOR. The power supply controller 145 (in particular, the first power supply controller 140 of FIG. 2) may perform operations of activating/deactivating a switching device connected to the column decoder CD via the third switch S3 (refer to SW3 of FIG. 13).

The DC voltage generator DG1 may be configured to generate the power voltage VDD_NOR. The DC voltage generator DG1 may receive an enable signal EN from the power supply controller 145 and may be enabled or disabled based on the enable signal EN. In other words, the DC voltage generator DG1 may be activated when the enable signal EN is in a first state and may be deactivated when the enable signal EN is in a second state. The enable signal EN may be generated in response to the second self refresh signal SELF2, and thus an operation for activating or deactivating the DC voltage generator DG1 may be performed via the second self refresh signal SELF2 (refer to VDD_NOR DC_GEN of FIG. 13).

Figure 5:
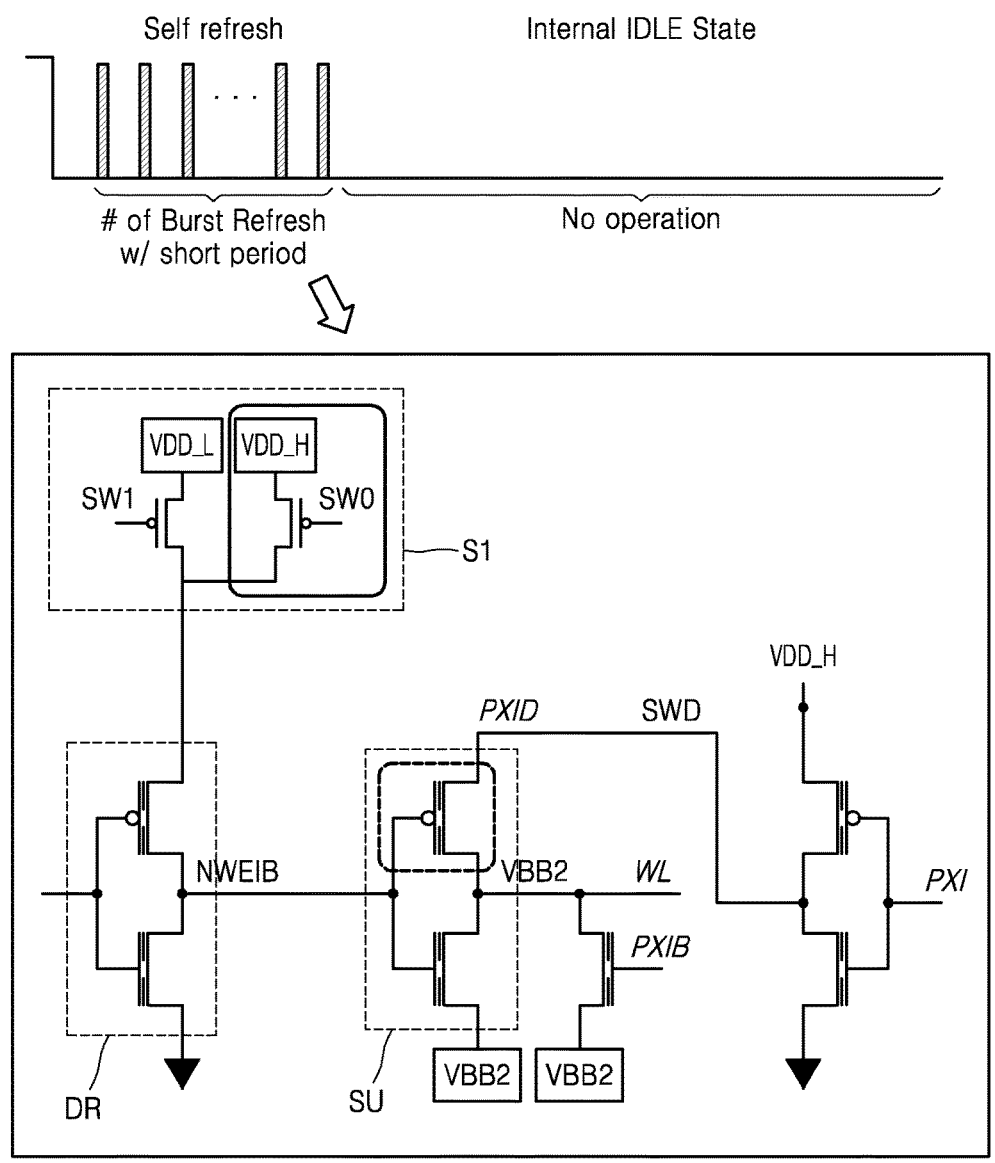
FIGS. 5 and 6 are diagrams showing configurations in which a first voltage or a second voltage is applied to a driver in a row decoder by a first switch of FIG. 4 in closer detail.
Figure 6:
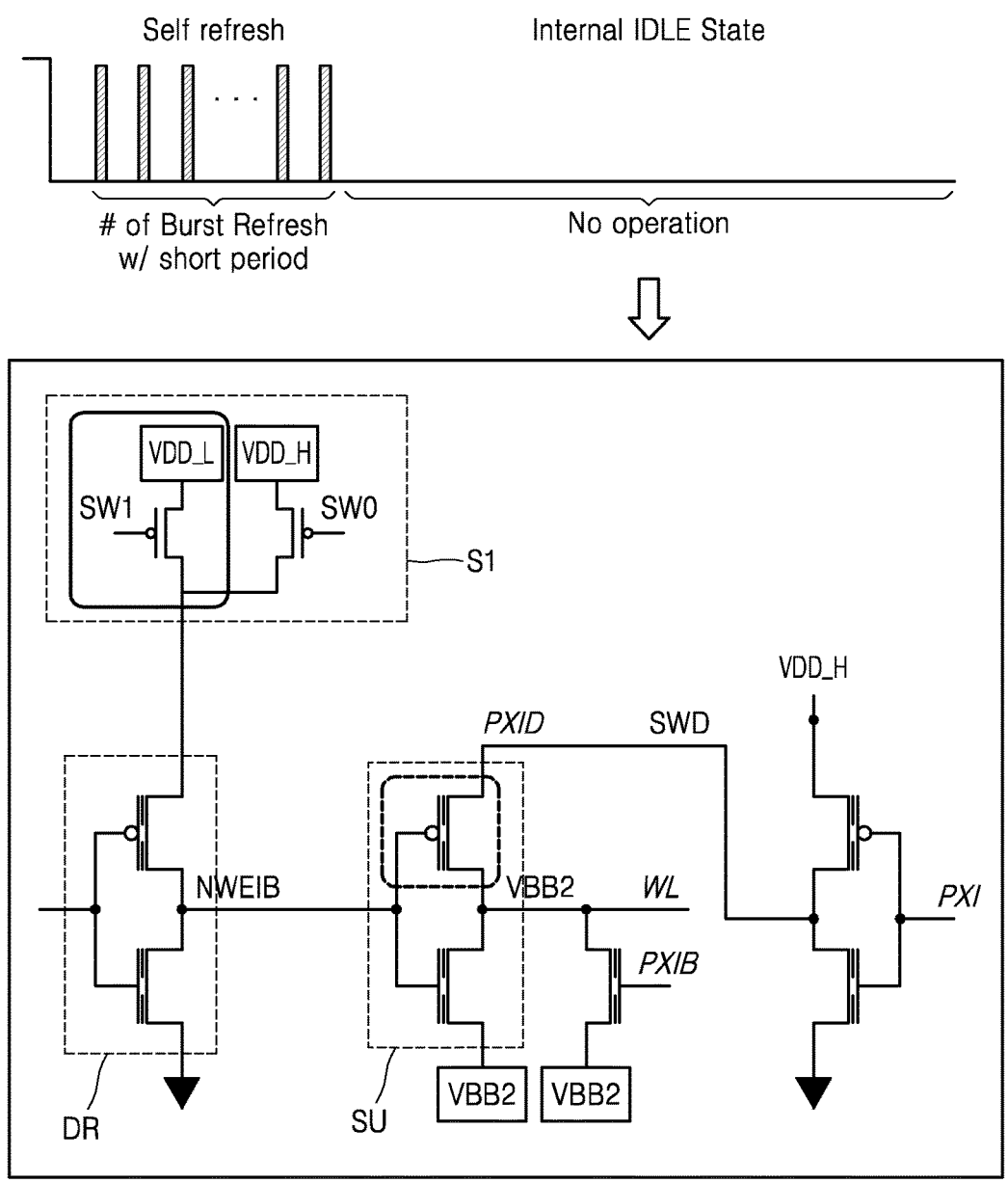

FIGS. 5 and 6 are diagrams showing configurations in which the first voltage VDD_H or the second voltage VDD_L is applied to a driver DR in a row decoder by the first switch S1 of FIG. 4 in closer detail.

According to the present example embodiment, the semiconductor device may further include a first switching device SW0 and a second switching device SW1. The first switching device SW0 may be configured to be activated during the first time interval T1 of a refreshing cycle and to apply the first voltage VDD_H to the driver DR connected to a memory cell. The second switching device SW1 may be configured to be activated during the second time interval T2 of the refreshing cycle and to apply the second voltage VDD_L to the driver DR. As described above, the second voltage VDD_L may be lower than the first voltage VDD_H.

Referring to FIG. 5, during the first time interval T1, the driver DR may receive the first voltage VDD_H and transfer the first voltage VDD_H to the gate of a switching unit SU. Therefore, the switching unit SU is activated and a burst refreshing operation may be performed on a memory cell of a word line connected to the switching unit SU.

Referring to FIG. 6, during the second time interval T2, the driver DR may receive the second voltage VDD_L and transfer the second voltage VDD_L to the gate of the switching unit SU. The second voltage VDD_L has a magnitude for maintaining the standby state of the switching unit SU, but may be less than the first voltage VDD_H. As the magnitude of the second voltage VDD_L decreases, leakage current (that is, a GIDL current) of the switching unit SU may be reduced.

The table below shows the leakage current reduction effect expected when a refreshing method according to an example embodiment of the inventive concepts is employed. Specifically, for a p-type transistor among transistors of the switching unit SU used in FIGS. 5 and 6, only leakage currents generated according to magnitudes of a voltage applied to the gate were measured.

| VPP level | iVPP[uA] | GIDL [uA] | Total [uA] |
|---|---|---|---|
| 3.2 | 0.00 | 28.0 | 28.00 |
| 3.0 | 13.60 | 14.0 | 27.60 |
| 2.8 | 28.00 | 7.0 | 35.00 |
| 2.6 | 42.32 | 3.5 | 45.82 |
| 2.4 | 56.60 | 1.8 | 58.35 |
| 2.2 | 70.80 | 0.9 | 71.68 |
| 2.0 | 85.00 | 0.4 | 85.44 |
| 1.8 | 99.12 | 0.2 | 99.34 |

As shown in the table, as the magnitude of the voltage applied to the gate decreases, the magnitude of the leakage current decreases.

According to example embodiments of the inventive concepts, in order to achieve such a reduction in leakage current, a refreshing operation may be intensively performed during the first time interval T1, such that power of the switching unit SU regarding substantially all rows may be controlled simultaneously, a standby state is maintained for the long and subsequent second time interval T2, and a DC voltage level supplied to a row decoder is controlled through the power supply controller 145.

Figure 7:
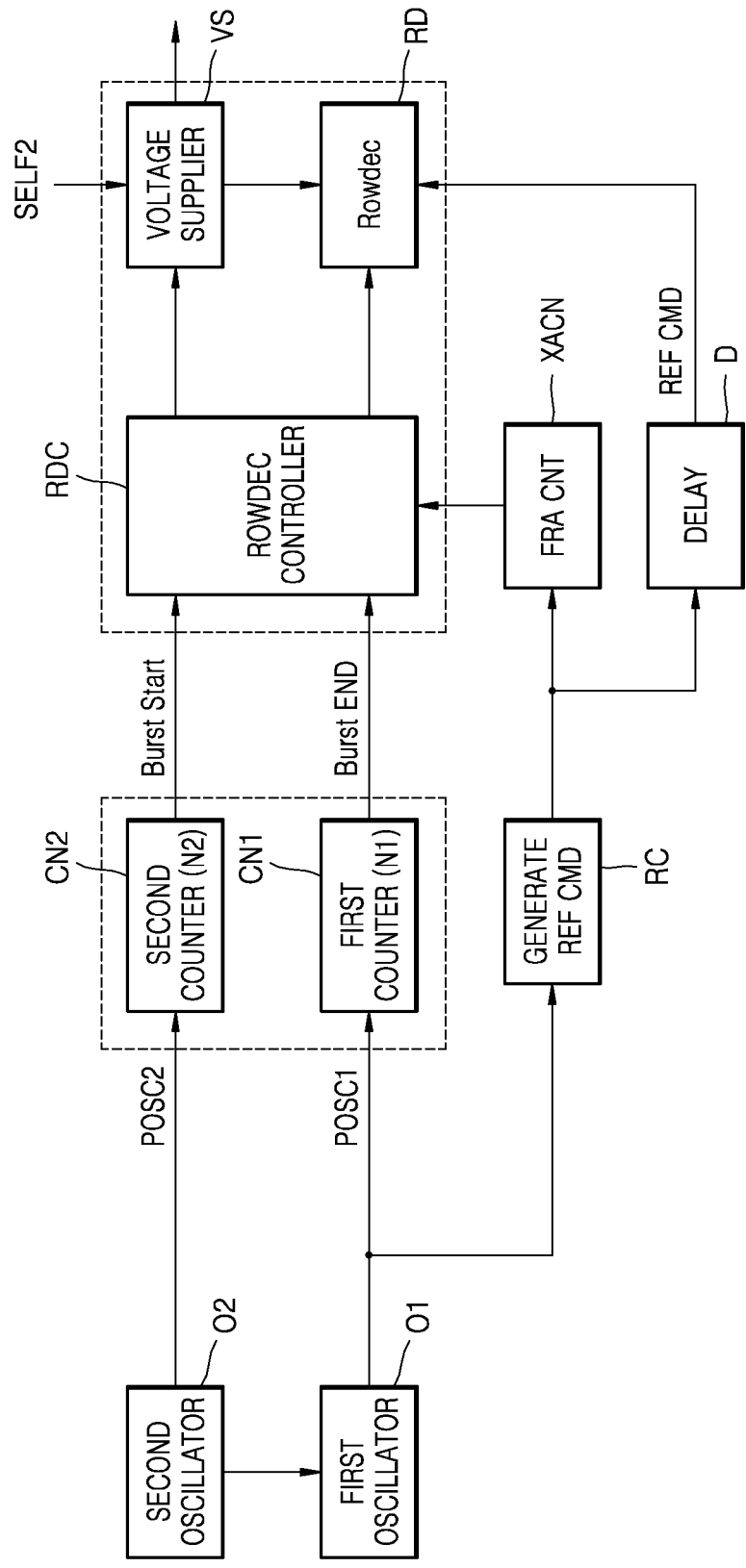
FIGS. 7 and 8 are block diagrams showing a refresh controller of a memory device according to example embodiments of the inventive concepts in closer detail.
Figure 8:
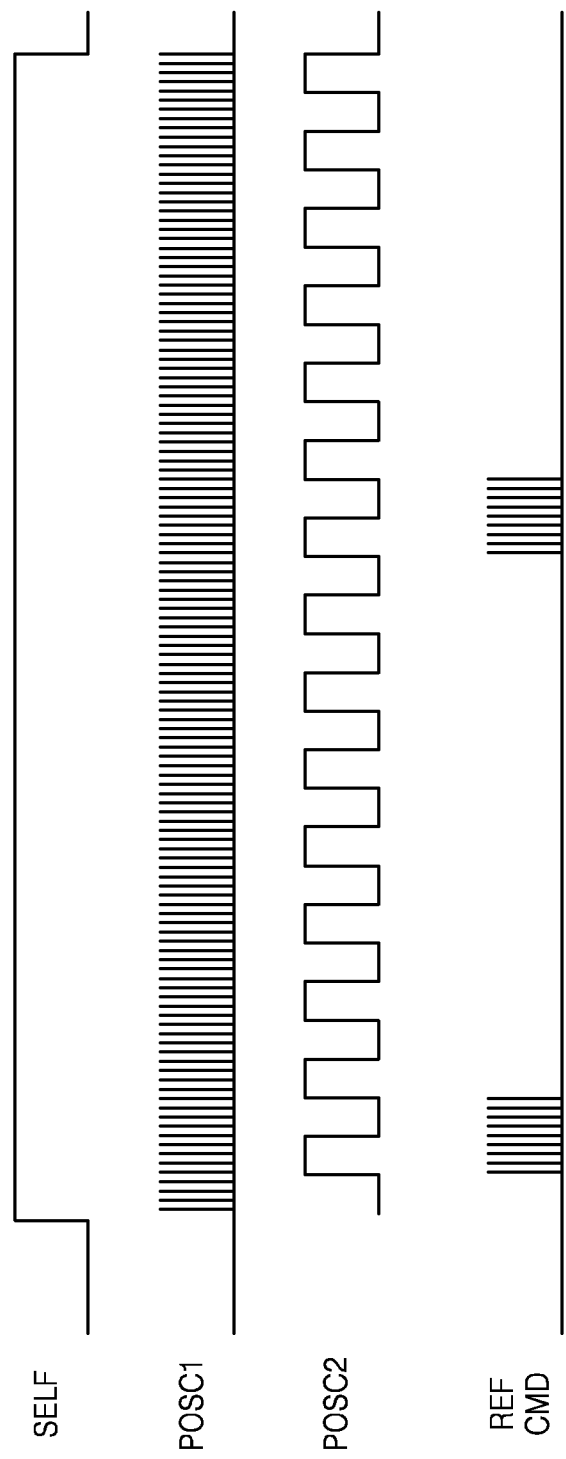

FIGS. 7 and 8 are block diagrams showing a refresh controller of a memory device according to example embodiments of the inventive concepts in closer detail. Redundant descriptions thereof are omitted below.

Referring to FIG. 7, the refresh controller of the memory device may include a first oscillator O1, a second oscillator O2, a first counter CN1, a second counter CN2, a refresh command generator RC, an internal address generating counter XACN, a delay D, a row decoder controller RDC, and a power supply VS.

Referring to FIGS. 7 and 8, the first oscillator O1 may be configured to generate a first oscillation signal POSC1. The period of a burst refreshing operation performed during the first time interval T1 may be determined based on the first oscillation signal POSC1. For example, the period of the first oscillation signal POSC1 may be from 1 to 10 times longer than tRFCmin (from about 90 to about 350 nanoseconds). In this case, a burst refreshing operation may be performed during a period from tRFCmin to 10*tRFCmin. Furthermore, the first oscillation signal POSC1 may be used to terminate a burst refreshing operation. For example, the first counter CN1 may generate a burst end signal based on the first oscillation signal POSC1.

The second oscillator O2 may be configured to generate a second oscillation signal POSC2. The second oscillation signal POSC2 is a signal for performing a conventional refreshing operation and may be a signal having a period from about 4 milliseconds to about 8 microseconds. The second oscillation signal POSC2 may be used to initiate a burst refreshing operation. For example, the second counter CN2 may generate a burst start signal based on the second oscillation signal POSC2. Furthermore, the second oscillation signal POSC2 may be used to switch from one refreshing cycle to another refreshing cycle.

The first counter CN1 may be configured to receive the first oscillation signal POSC1 and perform a counting operation. For example, when the memory device performs a refreshing operation on 8192 rows, the first counter CN1 may be configured to count to the number of rows (e.g., 8192). More specifically, when the period of the first oscillation signal POSC1 is 90 nanoseconds, the first counter CN1 may be configured to receive the first oscillation signal POSC1 having the period of 90 nanoseconds and count to 8192 during 7372.8 microseconds.

The second counter CN2 may be configured to receive the second oscillation signal POSC2 and perform a counting operation. For example, when the memory device performs a refreshing operation on 8192 rows, the second counter CN2 may be configured to count to the number of rows (e.g., 8192). More specifically, when the period of the second oscillation signal POSC2 is 7.8 microseconds, the second counter CN2 may be configured to receive the second oscillation signal POSC2 having the period of 7.8 microseconds and count 8192 during about 63897.6 microseconds (that is, about 64 milliseconds).

The refresh command generator RC may be configured to receive the first oscillation signal POSC1 and generate a refresh command signal REF CMD.

For example, referring to FIG. 8, the refresh command signal REF CMD includes a burst refresh signal generated in response to a burst start signal (generated based on the second oscillation signal POSC2) during the first time interval T1, and the generation of the burst refresh signal may be terminated in response to a burst end signal (generated based on the first oscillation signal POSC1). Thereafter, the refresh command signal REF CMD does not include a separate burst refresh signal during the second time interval T2.

The internal address generating counter XACN may be configured to generate an internal address signal in response to the refresh command signal REF CMD. The generated internal address signal may be transferred to the row decoder controller RDC. The delay D may delay the refresh command signal REF CMD and transfer the delayed refresh command signal REF CMD to the row decoder RD.

The row decoder controller RDC may be configured to generate a signal for controlling a driver of the row decoder RD based on the internal address signal. The row decoder controller RDC may also be configured to control the voltage supply VS that supplies a voltage to the row decoder RD.

According to an example embodiment, the voltage supply VS may be configured to supply a voltage to a column decoder (not shown). For example, the voltage supply VS may include a DC voltage generator that applies a voltage to the column decoder, and the DC voltage generator may be enabled/disabled in response to the second self refresh signal SELF2.

Figure 9:
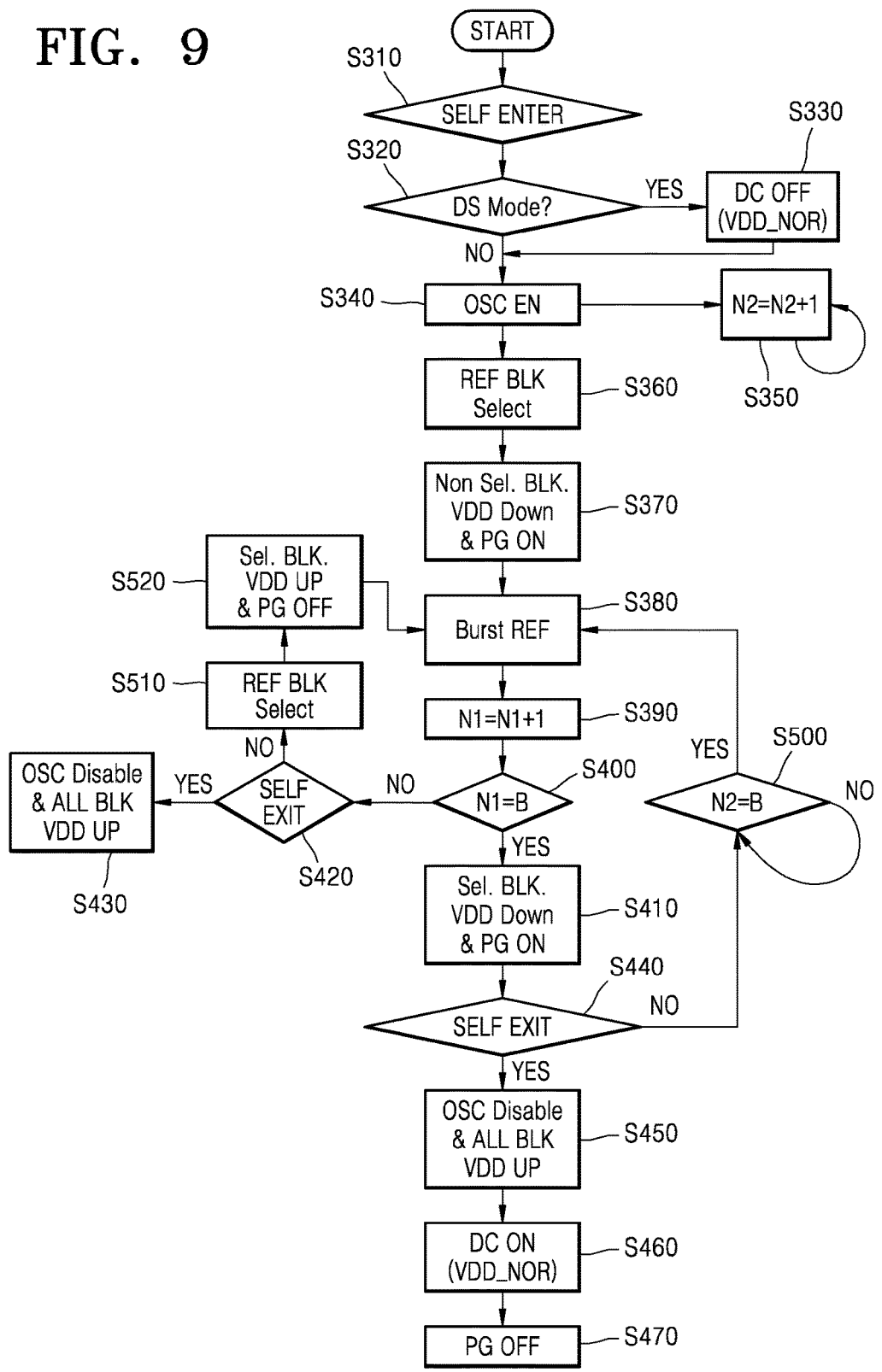
FIGS. 9 and 10 are flowcharts showing refreshing operations of a memory device according to example embodiments of the inventive concepts.

FIG. 9 is a flowchart showing a refreshing operation of a memory device according to some example embodiments of the inventive concepts. Hereinafter, for convenience of explanation, descriptions will be given in relation to a self refreshing operation, and redundant descriptions thereof are omitted.

Referring to FIGS. 4, 7, and 9, in operation s310, the self mode controller 110 may receive the first self refresh signal SELF1 and/or the second self refresh signal SELF2 and enter a self refreshing mode.

Next, in operation S320, the self mode controller 110 may determine whether the second self refresh signal SELF2 is received. If the second self refresh signal SELF2 is received (that is, in a deep sleep mode), in operation S330, the DC voltage generator DG1 may be deactivated.

The DC voltage generator DG1 may be configured to generate a DC voltage to apply the DC voltage to the column decoder CD and/or a write controller. The state of the related signal VDD_NOR may be switched for deactivation of the DC voltage generator DG1.

Therefore, a refreshing operation may be performed while maintaining only the minimum power supply for assuring cell data.

Next, in operation S340, the first oscillator O1 and the second oscillator O2 are activated, and thus the first oscillation signal POSC1 and the second oscillation signal POSC2 are generated.

In operation S350, the second counter CN2 may receive the second oscillation signal POSC2 and increase an N2 value (a counted number according to an actual refreshing period StREFi). The second counter C2 may be configured to perform a counting operation based on a certain value B. In other words, the second counter CN2 may perform a counting operation in the order of 0→1→2→ . . . →B→0→1→ . . . . , for example.

In operation S500, it is determined whether the N2 value reached a certain value (step S500). If the N2 value reached the certain value (e.g., 64 milliseconds elapsed), one refreshing cycle may be switched to another refreshing cycle, and thus, in operation S380, a burst refreshing operation may be performed again.

After an oscillator is activated, in operation S360, the first row decoder RD<0> and the column decoder CD may select a selected block SB.

Regarding an unselected block NB, in operation S370, the driving voltage of a word line driver is lowered from VDD_H to VDD_L and a power gating operation for deactivating power supplied for a refreshing operation regarding the unselected block NB is performed. The state of a related signal (e.g., PG_ON of FIG. 11) may be switched for the power gating operation.

Next, in operation S380, a burst refreshing operation is performed during the first time interval T1. An internal address is generated based on the refresh command signal REF CMD, and an operation for addressing a row corresponding to the internal address is performed. The burst refresh signal generated during the burst refreshing operation may have a period from tRFCmin to 10*tRFCmin.

In operation S390, a first counter CN1 receives a first oscillation signal POSC1 to increase N1 (a counted number according to a burst refreshing period BtREFi). The first counter CN1 may be configured to perform a counting operation based on a certain value B. In other words, the first counter CN1 may perform a counting operation in the order of 0→1→2→ . . . →B→0→1→ . . . . , for example.

Next, in operation S400, it is determined whether the N1 value reached a certain value (e.g., B=8192). If the N1 value reached the certain value, in operation s410, a driving voltage regarding a block to be refreshed is lowered and a power gating operation for deactivating power supplied for a refreshing operation regarding the corresponding block is performed.

Otherwise, if the N1 value did not reach the certain value B, in operation S420, it is determined whether to terminate the self refreshing operation. If the self refreshing operation is terminated, in operation S430, driving voltages of all blocks are raised for normal inputting/outputting operations and the first and second oscillators O1 and O2 of a refresh controller are deactivated.

According to some example embodiments, the memory device may include a storage and, if a self refreshing operation is terminated, the N1 value may be stored in a separate storage (not shown). When a next self refreshing operation is performed, the N1 value may be loaded and the self refreshing operation may be performed from a second address next to a first address corresponding to the N1 value. In other words, when a counter generates an address signal, a burst refreshing operation is performed on a memory cell corresponding to the first address and a refreshing cycle ends during the burst refreshing operation, a burst refreshing operation regarding a memory cell corresponding to the second address next to the first address may be performed. As a result, overdriving of a memory cell may be prevented.

Otherwise, if a self refreshing operation is not terminated, a burst refreshing operation regarding a row corresponding to an increased N1 value continues. Therefore, a burst refreshing operation regarding a block to be refreshed may be performed during the first time interval T1 as the N1 value is increased.

According to some example embodiments, during a burst refreshing operation during the first time interval T1, a row refreshing regarding one block to be refreshed may be completed and a row refreshing regarding another block to be refreshed may be performed. In other words, in operation S510, the selected block SB may be switched to an unselected block, and the unselected block NB is switched to a selected block.

In this case, in operation S520, a driving voltage VDD_H of the driver of a word line connected to a memory cell of the newly-switched selected block may be raised and a power gating operation for activating power supplied for a refreshing operation regarding the corresponding block may be performed.

For example, in an example embodiment where the total number of rows of one block is 8192, the number of burst refresh signals generated at once may not be 8192, but be a number less or greater than 8192. In other words, the certain value B that is as a criterion for determining in operation (e.g. operation S400) may not be identical to the actual number of rows of a block. In this case, since the number of burst refresh signals is not identical to the number of rows of a block to be refreshed, a selected block may be changed during a burst refreshing operation. The raising of the driving voltage and the power gating operations as described above may be performed in such a case.

After the N1 value reached a certain value (e.g., 8192), in operation S440, the driving voltage is lowered and the power gating operation is performed, and it is determined whether a self refreshing operation has ended. If the self refreshing operation has not ended, during the second time interval T2, GIDL, PG, and DC optimizations may be performed through switching operations of the leakage controller 130 and the power supply controller 145 until the N2 value reaches the certain value B (e.g., until 64 milliseconds elapsed after the start of a burst refreshing operation).

When the N2 value reaches the certain value B, in operation S380, one refreshing cycle is switched to another refreshing cycle, and a burst refreshing operation regarding a next selected region may be performed. In other words, a rest state according to a common refreshing cycle may be maintained until a next self refreshing operation, and then a burst refreshing operation may be performed. As described above, the certain value B that is a criterion for determining in operation (e.g. operation S500) may not be identical to the actual number of rows of a block.

If a self refreshing operation has ended, in operation S450, the driving voltages of all blocks are raised for normal inputting/outputting operations and the first and second oscillators O1 and O2 of the refresh controller are deactivated. Furthermore, when entered into a deep sleep mode, in operation S460, the deactivated DC voltage generator DG1 may be activated. Furthermore, in operation S470, a power gating operation for deactivating power supplied for a refreshing operation may be performed.

Figure 10:
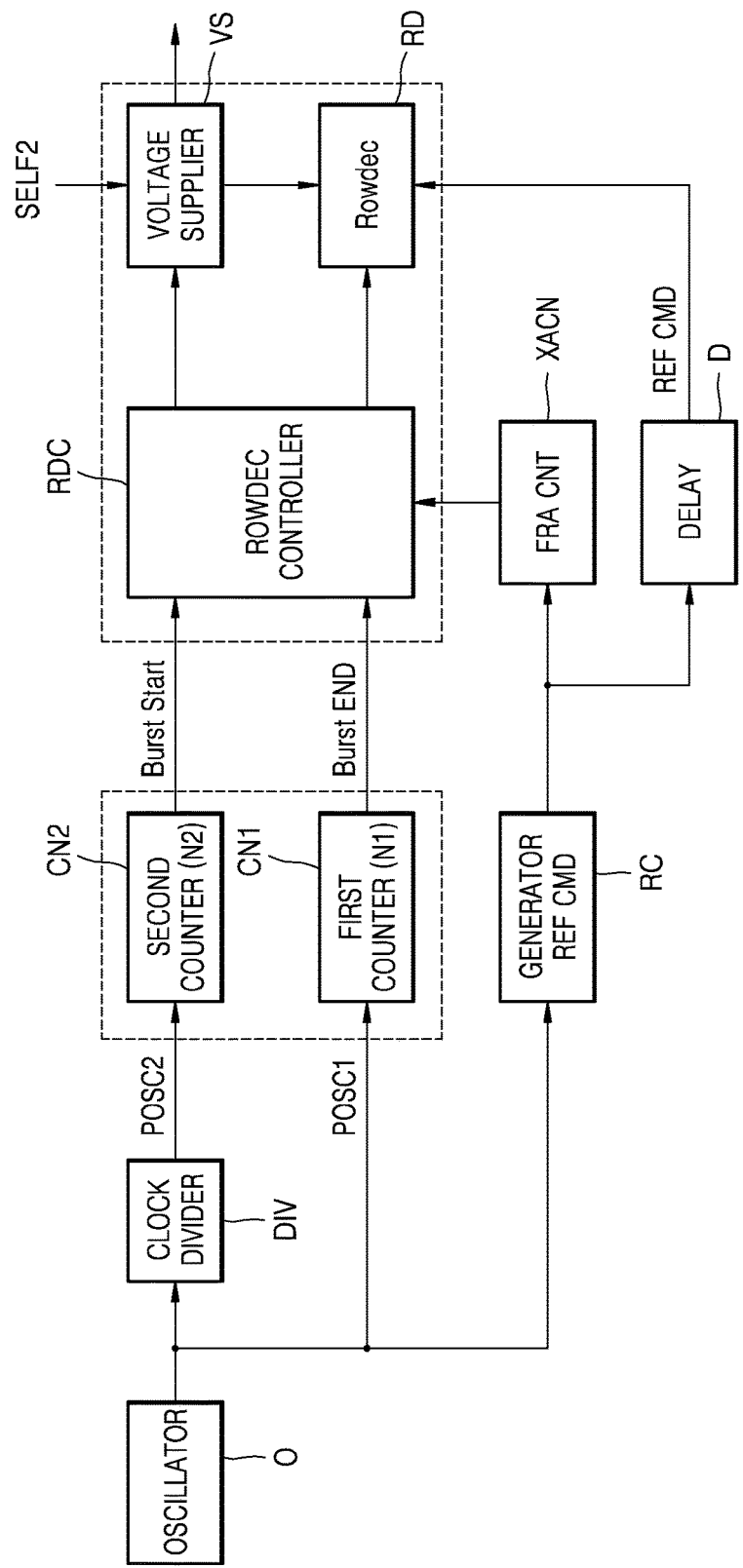

FIG. 10 is a diagram showing a modified example embodiment of the memory device of FIG. 7.

Referring to FIGS. 7 and 10, the memory device of FIG. 7 generates first and second oscillation signals by using two oscillators, whereas the memory device of FIG. 10 uses a single oscillator O and a clock divider DIV to generate first and second oscillation signal POSC1 and POSC2.

Figure 11:
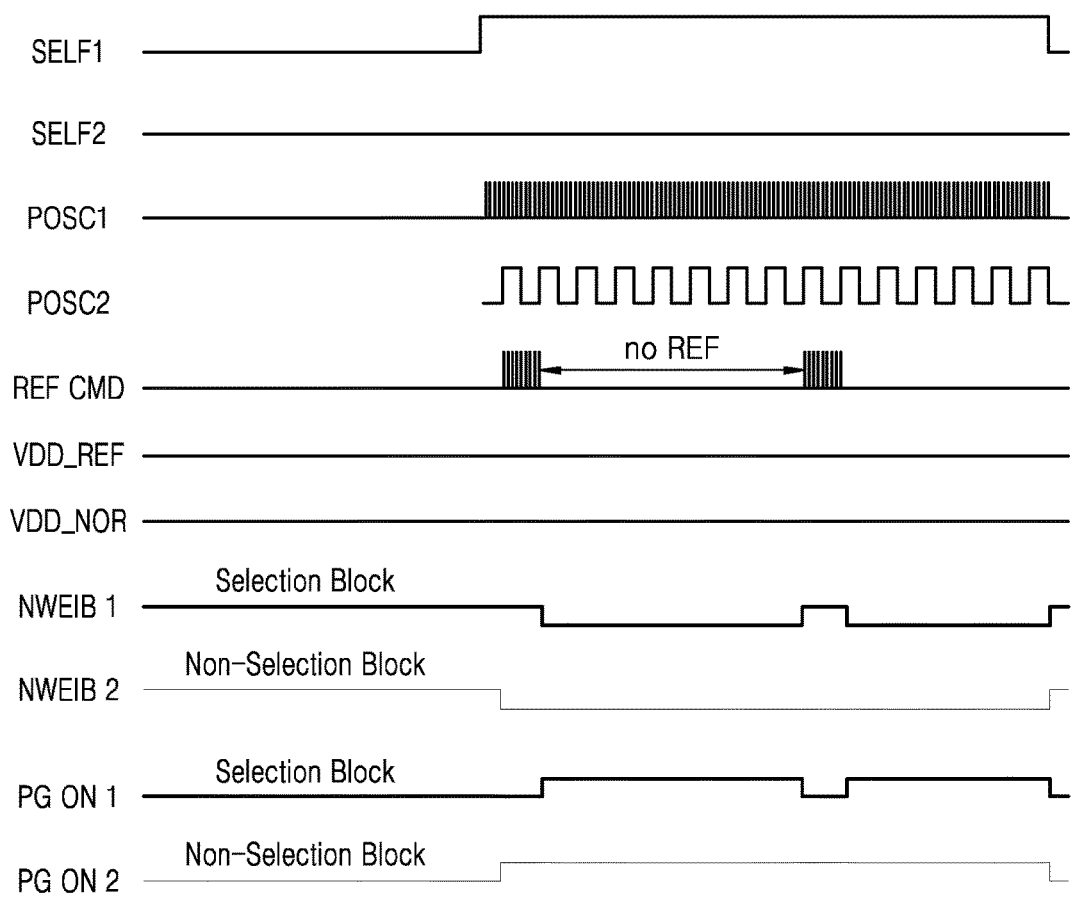
FIGS. 11 and 12 are timing diagrams showing refreshing operations of a memory device according to example embodiments of the inventive concepts.
Figure 12:
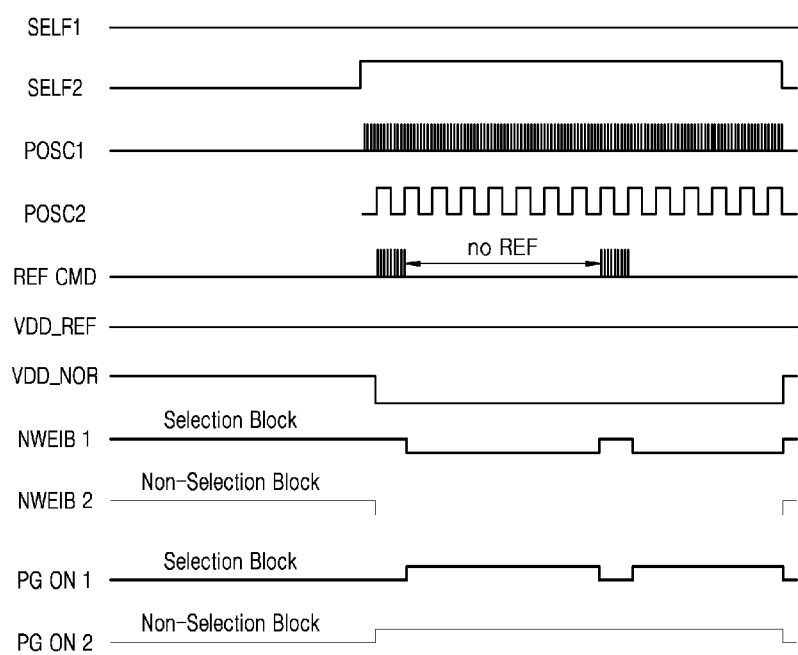

FIGS. 11 and 12 are timing diagrams showing refreshing operations of a memory device according to example embodiments of the inventive concepts. Redundant descriptions thereof are omitted.

FIG. 11 shows a refreshing operation when the first self refresh signal SELF1 is applied.

Referring to FIGS. 4, 7, and 11, as the first self refresh signal SELF1 is applied, the first oscillator O1 and the second oscillator O2 are activated and the refresh command signal REF CMD is generated. The power voltage VDD_REF used for a refreshing process and the power voltage VDD_NOR used by the column decoder CD are applied and refreshing cycles for the first time interval T1 and the second time interval T2 are performed.

During the first time interval T1 of the refreshing cycle, a signal PG_ON1 applied to a row switching device of the selected block SB (that is, a switching device connected to the first row decoder RD<0> of the selected block SB) maintains a low state. Therefore, the power voltage VDD_REF used for a refreshing process may be applied to the first row decoder RD<0>.

On the other hand, during the first time interval T1, a signal PG_ON2 applied to a row switching device of the unselected block NB (that is, a switching device connected to the second row decoder RD<1> of the selected block SB) maintains a high state. Therefore, the power voltage VDD_REF used for the refreshing process may not be applied to the second row decoder RD<1> due to power gating. As a result, as the power voltage VDD_REF is applied only to the first row decoder RD<0> where the refreshing process is performed and a corresponding refreshing circuit, power consumption may be reduced.

During the second time interval T2 of the refreshing cycle, no burst refreshing operation is performed, and thus a power gating operation is performed. For example, the signal PG_ON1 applied to the row switching device of the selected block SB (that is, a switching device connected to the first row decoder RD<0> of the selected block SB) may be switched to the high state. Furthermore, during the first time interval T1, the signal PG_ON2 applied to the row switching device of the unselected block NB (that is, a switching device connected to the second row decoder RD<I> of the selected block SB) may continuously maintain the high state. Therefore, the power voltage VDD_REF used for a refreshing process may not be applied to the first and second row decoders RD<0> and RD<I> due to power gating, and thus power consumption may be reduced during the second time interval T2.

During the first time interval T1 of the refreshing cycle, the drivers of memory cells of the selected block SB receive the driving voltage VDD_H, and thus an output voltage NWEIB1 may become the driving voltage VDD_H. On the other hand, during the first time interval T1, the drivers of memory cells of the unselected block NB receive the voltage VDD_L, the voltage VDD_L being lower than the driving voltage VDD_H, and thus the output voltage NWEIB1 may become the driving voltage VDD_L that is lower than the driving voltage VDD_H.

Next, during the second time interval T2, the output voltage NWEIB1 of the drivers of the memory cells of the selected block SB is switched to the voltage VDD_L that is lower than the driving voltage VDD_H, and an output voltage NWEIB2 of the memory cells of the unselected block NB may be maintained at the voltage VDD_L that is lower than the driving voltage VDD_H. Therefore, the driving voltage applied to the switching unit (SU of FIG. 5) during the second time interval T2 may be lowered from VDD_H to VDD_L, and thus GILD current may decrease during the second time interval T2.

FIG. 12 shows a refreshing operation when the second self refresh signal SELF2 is applied. The refreshing operation of FIG. 12 is overall similar to that of FIG. 11, except that the power supply controller 145 (specifically, the second power supply controller 145 of FIG. 2) generates the enable signal EN in response to the second self refresh signal SELF2 and enters into a deep sleep mode.

In the deep sleep mode, the DC voltage generator DG1 supplying a DC voltage to a column switching device may be deactivated. Therefore, power consumption due to the driving of the DC voltage generator DG1 may be further reduced. On the other hand, it takes some time for the DC voltage generator DG1 to be activated again after being deactivated, where the time period may affect an operation of the memory device. Therefore, the deep sleep mode may be entered only when there is a separate command signal (that is, only when the second self refresh signal SELF2 is generated).

According to an example embodiment, the second time interval T2 may be extended in the deep sleep mode. For example, a refresh controller may generate a retention signal to extend a refreshing cycle and perform an operation like overdriving a sense amplifier to allow the second time interval T2 to be maintained longer than a previously defined second time interval.

Figure 13:
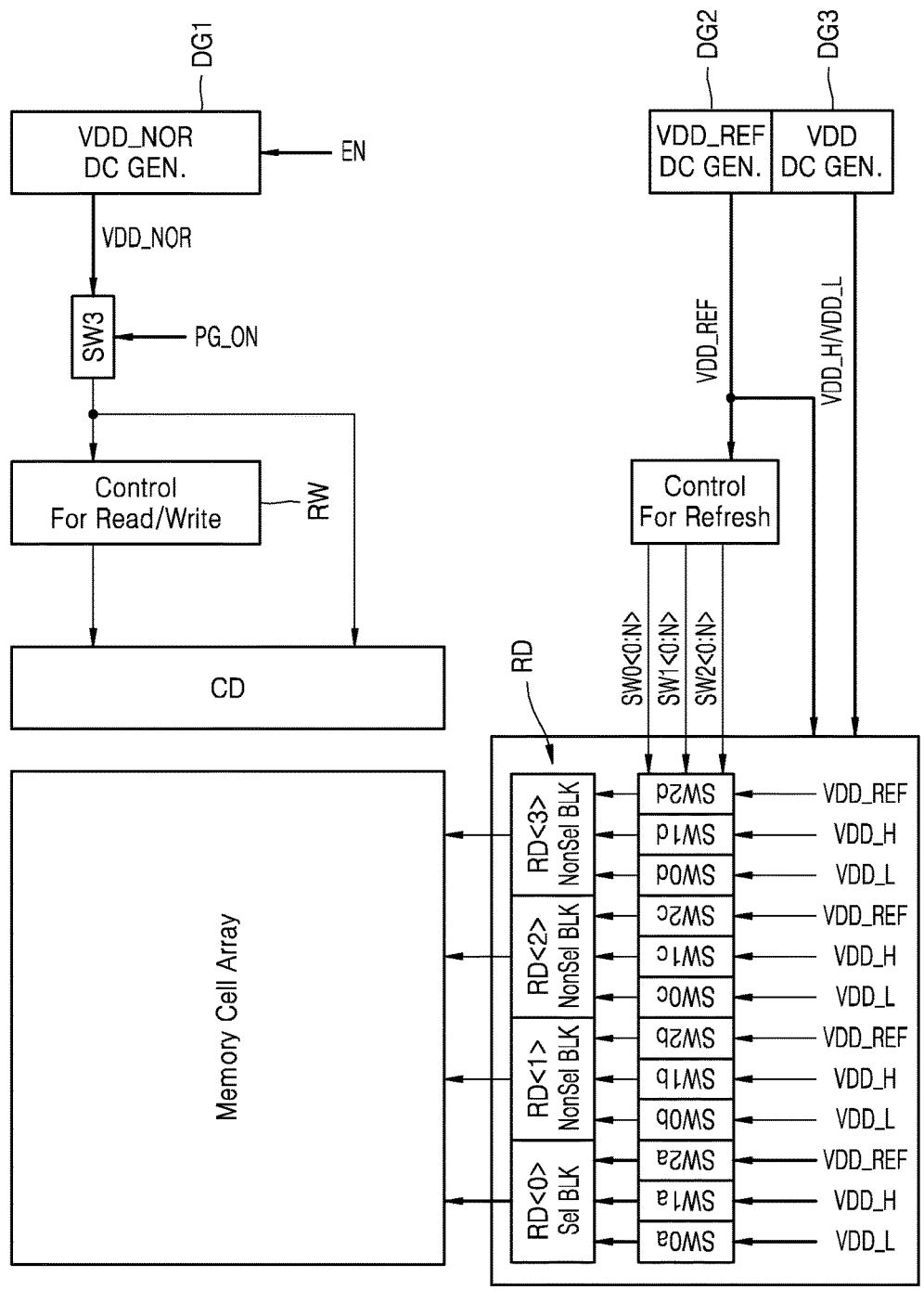
FIG. 13 is a block diagram of a memory device according to example embodiments of the inventive concepts.
Figure 14:
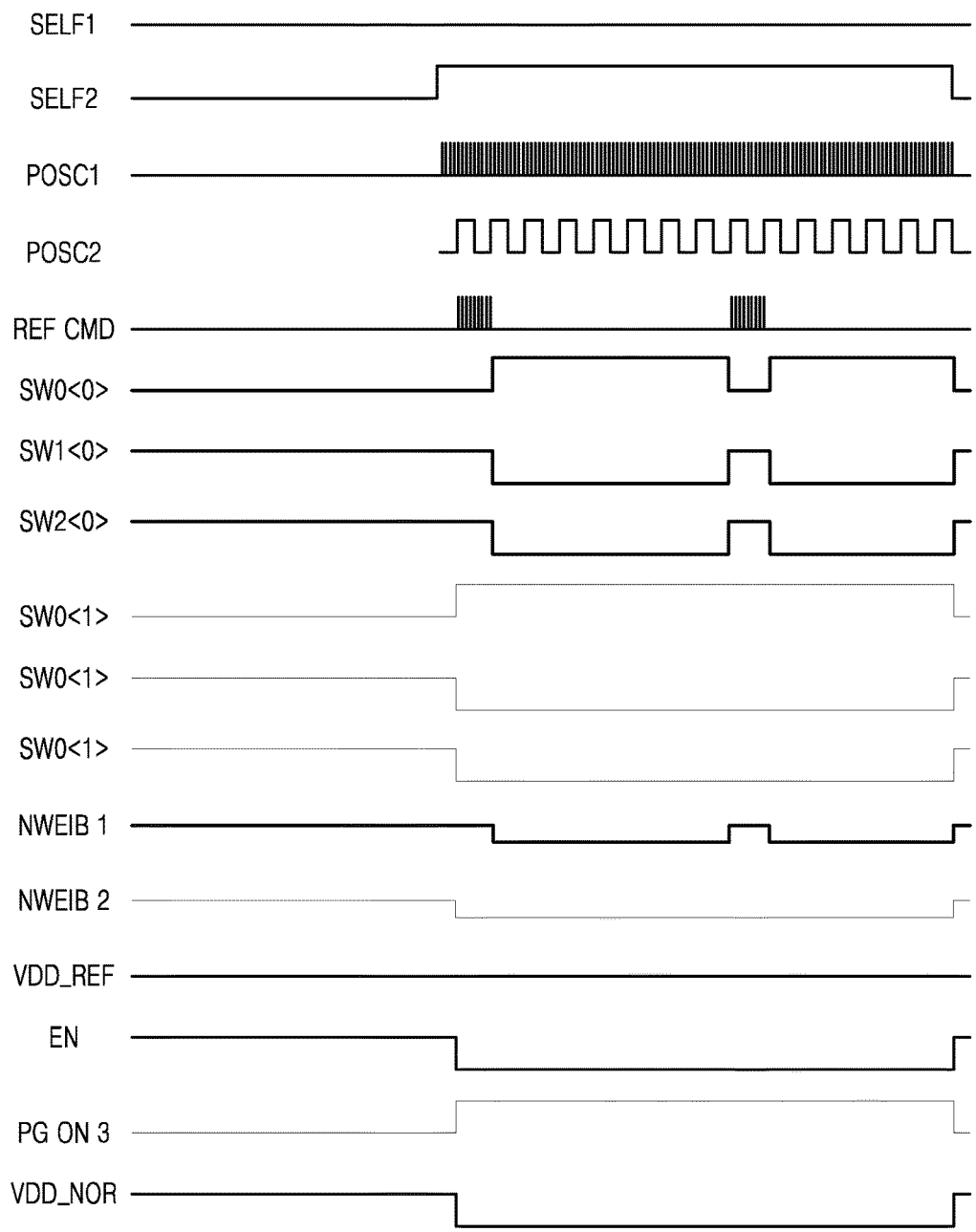
FIG. 14 is a timing diagram of a refreshing operation of the memory device of FIG. 13.

FIG. 13 is a block diagram of a memory device according to example embodiments of the inventive concepts. FIG. 14 is a timing diagram of a refreshing operation of the memory device of FIG. 13. Redundant descriptions thereof are omitted.

Referring to FIG. 13, the memory device may include a VDD_NOR DC voltage generator DG1, a VDD_REF DC voltage generator DG2, and a VDD_L/VDD_H DC voltage generator DG3. Furthermore, the memory device may include row switching devices SW0, SW1, and SW2 for transferring DC voltages to a row decoder, and a column switching device SW3 for transferring DC voltages to the column decoder CD and/or a write/read controlling circuit RW.

The row switching devices SW0, SW1, and SW2 may include first row switching devices SW0a, SW0b, SW0c, and SW0d for transferring the voltage VDD_L to a row decoder, second row switching devices SW1a, SW1b, SW1c, and SW1d for transferring the voltage VDD_H to the row decoder, and third row switching devices SW2a, SW2b, SW2c, and SW2d for transferring the voltage VDD_REF to the row decoder.

The first row switching devices SW0a, SW0b, SW0c, and SW0d may include a switching device SW0a for applying the voltage VDD_L to a selected block and switching devices SW0b, SW0c, and SW0d for applying the voltage VDD_L to an unselected block. The second row switching devices SW1a, SW1b, SW1c, and SW1d may include a switching device SW1a for applying the voltage VDD_H to the selected block, and switching devices SW1b, SW1c, and SW1d for applying the voltage VDD_H to the unselected block. The third row switching devices SW2a, SW2b, SW2c, and SW2d may include a switching device SW2a for applying the voltage VDD_REF to the selected block and switching devices SW2b, SW2c, and SW2d for applying the voltage VDD_REF to the unselected block.

The refresh controller may generate a control signal SW0<0:N> for controlling the first row switching devices SW0a, SW0b, SW0c, and SW0d, a control signal SW1<0:N> for controlling the second row switching devices SW1b, SW1c, and SW1d, and a control signal SW2<0:N> for controlling the third row switching devices SW2a, SW2b, SW2c, and SW2d and transfer the control signals to the first through third row switching devices SW2a, SW2b, SW2c, and SW2d. Furthermore, the power supply controller of the refresh controller (e.g., the first power supply controller 140 of FIG. 2) may apply a control signal PG_ON3 to the column switching device SW3.

Although only the first through fourth row decoders RD<0>, RD<1>, RD<2>, and RD<3> are shown, example embodiments of the inventive concepts are not limited thereto. The number of row decoders may be K+1. In this case, the refresh controller may generate control signals SW0<0:N>, SW1<0:N>, . . . and SWK<0:N> with respect to the K+1 row decoders.

Referring to FIGS. 7 and 14, as the second self refresh signal SELF2 is applied, the first oscillator O1 and the second oscillator O2 are activated and the refresh command signal REF CMD is generated. The power voltage VDD_REF used for a refreshing operation is applied, and a refreshing cycle during the first time interval T1 and the second time interval T2 is performed.

Meanwhile, as the second self refresh signal SELF2 is applied, the state of the enable signal EN is switched and the VDD_NOR DC voltage generator DG1 may be deactivated. Therefore, the output voltage VDD_NOR of the VDD_NOR DC voltage generator DG1 may be switched from the high state to the low state.

During the first time interval T1 of the refreshing cycle, a signal SW0<0> applied to the first row switching device SW0a of the selected block is maintained at the low state, and thus the first row switching device SW0a is deactivated. Furthermore, a signal SW1<0> applied to the second row switching device SW1a of the selected block is maintained at the high state, and thus the second row switching device SW1a is activated. Therefore, among the first voltage VDD_H and the second voltage VDD_L generated by the VDD_L/VDD_H DC voltage generator DG3, the first voltage VDD_H is applied to the first row decoder RD<0>, the second voltage VDD_L being lower than the first voltage VDD_H.

Meanwhile, during the first time interval T1 of the refreshing cycle, a signal SW0<1> applied to the first row switching device SW0b of the unselected block is maintained at the high state, and thus the first row switching device SW0b is activated. Furthermore, a signal SW1<1> applied to the second row switching device SW1b of the unselected block is maintained at the low state, and thus the second row switching device SW1b is deactivated. Therefore, among the first voltage VDD_H and the second voltage VDD_L generated by the VDD_L/VDD_H DC voltage generator DG3, the second voltage VDD_L being lower than the first voltage VDD_H, the second voltage VDD_L may be applied to the second row decoder RD<1>. Similar to the second row switching device SW1b, the second row switching devices SW1c and SW1c are also deactivated and the second voltage VDD_L may be applied to the third row decoder RD<2> and the fourth row decoder RD<3>.

Meanwhile, during the first time interval T1, a signal SW2<0> applied to the third row switching device SW2a of the selected block is maintained at the high state, and thus the third row switching device SW2a is activated. Therefore, the power voltage VDD_REF used for a refreshing process may be applied to the first row decoder RD<0> due to power gating.

On the other hand, during the first time interval T1, a signal SW2<1> applied to the third row switching device SW2b of the unselected block is maintained at the low state, and thus the third row switching device SW2b is deactivated. Therefore, the power voltage VDD_REF used for the refreshing process may not be applied to the second row decoder RD<1> due to power gating. The third row switching devices SW2c and SW2d are also deactivated, and thus the power voltage VDD_REF may not be applied to the third row decoder RD<2> and the fourth row decoder RD<3>.

Therefore, since the power voltage VDD_REF is applied only to the first row decoder RD<0> where a burst refreshing operation is performed, power consumption may be reduced.

During the second time interval T2 of the refreshing cycle, no burst refreshing operation is performed, and thus a leakage current controlling operation and a power gating operation may be performed.

Specifically, during the second time interval T2, the signal SW0<0> applied to the first row switching device SW0a of the selected block is switched from the low state to the high state, and thus the first row switching device SW0a may be activated. Furthermore, the signal SW0<1> applied to the second row switching device SW1a of the selected block is switched from the high state to the low state, and thus the second row switching device SW1a may be deactivated. Furthermore, the signal SW1<1> applied to the second row switching device SW1b of the unselected block is maintained at the low state, and thus the deactivated state of the second row switching device SW1b may be maintained. Therefore, during the second time interval T2, among the first voltage VDD_H and the second voltage VDD_L that is lower than the first voltage VDD_H, the second voltage VDD_L may be applied to the first row decoder RD<0> and the second row decoder RD<1>. Similarly, the second voltage VDD_L may be applied to the third row decoder RD<2> and the fourth row decoder RD<3>.

Furthermore, during the second time interval T2, the signal SW2<0> applied to the third row switching device SW2a of the selected block is switched from the high state to the low state, and thus the third row switching device SW2a may be deactivated. Furthermore, the signal SW2<1> applied to the third row switching devices SW2a, SW2b, SW2c, and SW2d of the unselected block may be maintained at the low state. Therefore, the power voltage VDD_REF used for a refreshing operation may not be applied to the first row decoder RD<0> and the second row decoder RD<1> due to power gating. Similarly, the power voltage VDD_REF may not be applied to the third row decoder RD<2> and the fourth row decoder RD<3>.

As described above with reference to FIG. 11, during the first time interval T1 of the refreshing cycle, the drivers of memory cells of a selected block receive the driving voltage VDD_H, and thus the driving voltage VDD_H may be output as the output voltage NWEIB1. On the other hand, during the first time interval T1, the drivers of memory cells of an unselected block receive a voltage VDD_L that is lower than the driving voltage VDD_H, and thus the driving voltage VDD_L that is lower than the driving voltage VDD_H may be output as the output voltage NWEIB1.

During the second time interval T2, the output voltage NWEIB1 of the drivers of the memory cells of the selected block is switched to the voltage VDD_L that is lower than the driving voltage VDD_H, and the output voltage NWEIB2 of the drivers of the memory cells of the unselected block may be maintained at the voltage VDD_L that is lower than the driving voltage VDD_H. Therefore, the driving voltage applied to the switching unit SU during the second time interval T2 may be reduced (VDD_H→VDD_L) through GIDL controlling, and thus the leakage current is controlled during the second time interval T2. As a result, power consumption may be reduced.

Meanwhile, referring to FIGS. 13 and 14, the power supply controller of the refresh controller (in particular, the first power supply controller (140 of FIG. 2)) may be configured to deactivate the column switching device SW3 during the first time interval T1 and the second time interval T2, regardless of whether the device is in the deep sleep mode. To this end, the refresh controller may generate a control signal PG_ON3 and apply the control signal PG_ON3 to the column switching device SW3.

More particularly, referring to FIG. 14, as a refreshing cycle is started, the control signal PG_ON3 may be switched to the high state during the first time interval T1 and the second time interval T2, and thus the switching device SW3 may be deactivated. Since the column decoder CD does not perform any other function during a refreshing operation, power consumption may be reduced through power gating using the control signal PG_ON3.

Figure 15:
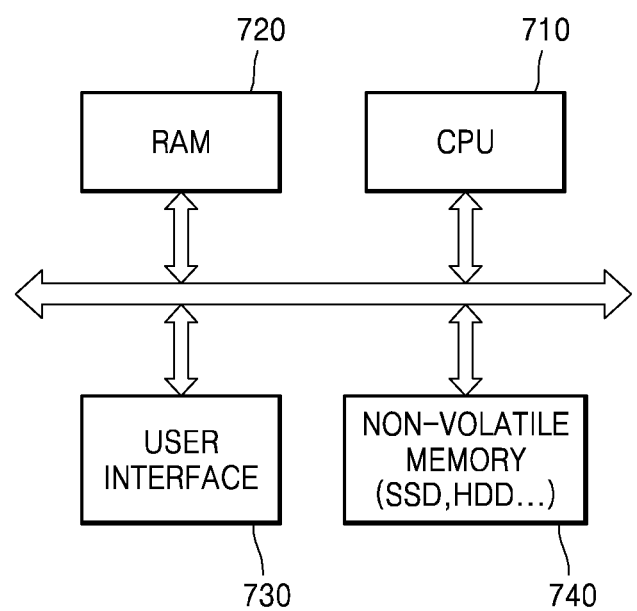
FIG. 15 is a block diagram showing a computing system equipped with a memory device according to an example embodiment of the inventive concepts.

FIG. 15 is a block diagram showing a computing system equipped with a memory device according to an example embodiment of the inventive concepts.

Referring to FIG. 15, a memory device according to example embodiments of the inventive concepts may be mounted as RAM 720 in a computing system 700, such as a mobile device or a desktop computer. The memory device mounted as the RAM 720 may be a memory device of any of the example embodiments described above. Furthermore, a memory controller according to the example embodiments of the inventive concepts may be provided in the RAM 720 or may be implemented in a CPU 710 as a memory control module.

The computing system 700 according to an example embodiment of the inventive concepts includes the CPU 710, the RAM 720, a user interface 730, and a non-volatile memory 740, which components are electrically connected to a bus 750. The non-volatile memory 740 may be a mass storage device, such as an SSD or an HDD.

As a memory device (or a memory system) according to an example embodiment of the inventive concepts is applied to the computing system 700, a memory controller provided in the RAM 720 and/or a memory control module that may be included in the CPU 710 may perform a refreshing operation according to the above-described embodiment. In other words, the RAM 720 includes a plurality of memory areas (e.g., banks), and refreshing operations may be managed for respective banks.

While example embodiments of the inventive concepts have been particularly shown and described with reference to some example embodiments thereof, it will be understood that various changes in form and details may be made therein without departing from the spirit and scope of the following claims.

What is claimed is:

1. A memory device comprising:
a plurality of memory cells; and
a self refresh controller configured to perform a refreshing cycle a plurality of times, the refreshing cycle including,
a burst refreshing operation performed during a first time interval, and
a power supply controlling operation performed during a second time interval, the second time interval being longer than the first time interval,
wherein the self refresh controller is configured to increase the second time interval in response to a deep sleep signal.

2. The memory device of claim 1, further comprising:
at least one driver configured to drive the plurality of memory cells, wherein
the self refresh controller includes a leakage controller configured to control the at least one driver, the leakage controller is configured to apply a first voltage to the at least one driver during the first time interval, and to apply a second voltage to the at least one driver during the second time interval, the second voltage being lower than the first voltage.

3. The memory device of claim 2, further comprising:
a first switching device configured to activate during the first time interval to apply the first voltage to the at least one driver; and
a second switching device configured to activate during the second time interval to apply the second voltage to the at least one driver.

4. The memory device of claim 1, wherein the memory device is configured to not perform the burst refreshing operation during the second time interval.

5. The memory device of claim 1, wherein
the plurality of memory cells include memory cells arranged in a selected block and memory cells arranged in an unselected block, and
the self refresh controller includes a first power supply controller configured to perform the power supply controlling operation on at least one of the selected block and the unselected block.

6. The memory device of claim 5, further comprising:
a first row decoder connected to the memory cells of the selected block;
a second row decoder connected to the memory cells of the unselected block;
a first row switching device configured to transfer a power voltage to the first row decoder; and
a second row switching device configured to transfer a power voltage to the second row decoder, wherein
the first power supply controller is configured to,
activate the first row switching device and deactivate the second row switching device during the first time interval of the refreshing cycle, and
deactivate the first row switching device and the second row switching device during the second time interval of the refreshing cycle.

7. The memory device of claim 5, further comprising:
a column decoder connected to the memory cells of the selected block and the unselected block; and
a column switching device connected to the column decoder,
wherein the first power supply controller is configured to deactivate the column switching device during the first time interval and the second time interval of the refreshing cycle.

8. The memory device of claim 7, wherein the memory device further comprises:
a DC voltage generator configured to supply a DC voltage to the column switching device, wherein
the self refresh controller further includes a second power supply controller configured to deactivate the DC voltage generator in response to a deep sleep signal.

9. The memory device of claim 1, wherein the self refresh controller further comprises:
a counter configured to receive an oscillation signal, and to generate a plurality of address signals.

10. The memory device of claim 9, wherein,
the plurality of address signals include a first address and a second address next to the first address, and
when the refreshing cycle terminates during the burst refreshing operation regarding a memory cell corresponding to the first address and the refreshing cycle is resumed, the self refresh controller is configured to perform the burst refreshing operation regarding a memory cell corresponding to the second address.

11. A memory device comprising:
a plurality of memory cells;
at least one driver associated with a row decoder, the at least one driver configured to drive the plurality of memory cells; and
a self refresh controller configured to perform a refreshing cycle a plurality of times, the refreshing cycle including,
applying a first voltage to the at least one driver and performing a burst refreshing operation on memory cells corresponding to a plurality of address signals during a first time interval, the burst refreshing operation including incrementing a count of a counter based on an oscillation signal to generate the plurality of address signals, providing the plurality of address signals to the row decoder to refresh respective rows of the plurality of memory cells, and terminating the burst refreshing operation in response to the count reaching a number of the rows in a block of the plurality of memory cells, and
applying a second voltage to the at least one driver during a second time interval, the second voltage being lower than that first voltage, the second time interval being longer than the first time interval.

12. The memory device of claim 11, wherein the self refresh controller is configured to perform the burst refreshing operation at an interval from tRFCmin to 10*tRFCmin.

13. The memory device of claim 11, wherein the self refresh controller is configured to,
terminate the burst refreshing operation based on a first oscillation signal, and
initiate the burst refreshing operation based on a second oscillation signal, the second oscillation signal having a period longer than that of the first oscillation signal.

14. The memory device of claim 13, wherein the self refresh controller is configured to switch from one refreshing cycle to another refreshing cycle based on the second oscillation signal.

15. A self-refresh controller configured to control a memory cell array, the self-refresh controller comprising:
a memory; and
processing circuitry configured to iteratively,
perform a burst refreshing operation on the memory cell array during a first time interval, the burst refreshing operation including incrementing a count of a counter based on an oscillation signal to generate a plurality of address signals, providing the plurality of address signals to a row decoder to refresh respective rows of the plurality of memory cells, and terminating the burst refreshing operation in response to the count reaching a number of the rows in a block of the memory, and
perform a power supply controlling operation on the memory cell array during a second time interval, the second time interval being subsequent to and longer than the first time interval.

16. The self-refresh controller of claim 15, wherein the processing circuitry comprises:
a first power supply controller configured to perform the power supply controlling operation on at least one of a selected block and an unselected block of the memory cell array; and
a second power supply controller configured to selectively set the self-refresh controller to a deep sleep mode during the power supply controlling operation by blocking supply of a direct current (DC) voltage to row decoders, the row decoders configured to selectively activate word lines of the memory cell array.

17. The self-refresh controller of claim 16, wherein the first power supply controller is configured to perform a power gating operation during the power supply controlling operation by blocking a power voltage from being applied to a first one of row decoders and a second one of the row decoders, the first one of the row decoders being connected to the selected block and the second one of the row decoders being connected to the unselected block.

18. The self-refresh controller of claim 15, wherein the processing circuitry is configured to,
   apply a first voltage to at least one driver and perform the burst refreshing operation on memory cells of the memory cell array corresponding to the plurality of address signals during the first time interval, and
   apply a second voltage to the at least one driver during the second time interval, the second voltage being lower than that first voltage.

19. The self-refresh controller of claim 18, wherein the processing circuitry is configured to set a magnitude of the second voltage to a value to maintain a standby state of a switching unit configured to drive the memory cells during the second time interval.

* * * * *